United States Patent
Sangle

(10) Patent No.: US 11,575,065 B2
(45) Date of Patent: Feb. 7, 2023

(54) TUNING OF EMISSION PROPERTIES OF QUANTUM EMISSION DEVICES USING STRAIN-TUNED PIEZOELECTRIC TEMPLATE LAYERS

(71) Applicant: Applied Materials, Inc., Santa Clara, CA (US)

(72) Inventor: Abhijeet Laxman Sangle, Mumbai (IN)

(73) Assignee: Applied Materials, Inc., Santa Clara, CA (US)

( * ) Notice: Subject to any disclaimer, the term of this patent is extended or adjusted under 35 U.S.C. 154(b) by 217 days.

(21) Appl. No.: 17/162,909

(22) Filed: Jan. 29, 2021

(65) Prior Publication Data

US 2022/0246787 A1   Aug. 4, 2022

(51) Int. Cl.
| | |
|---|---|
| *H01L 33/06* | (2010.01) |
| *H01L 33/32* | (2010.01) |
| *H01L 33/40* | (2010.01) |
| *H01L 33/00* | (2010.01) |
| *G06N 10/00* | (2022.01) |

(52) U.S. Cl.
CPC ......... *H01L 33/0004* (2013.01); *G06N 10/00* (2019.01); *H01L 33/007* (2013.01); *H01L 33/06* (2013.01); *H01L 33/32* (2013.01); *H01L 33/40* (2013.01); *H01L 2933/0016* (2013.01)

(58) Field of Classification Search
CPC ... H01L 33/06; H01L 33/007; H01L 33/0004; H01L 33/40; H01L 33/24; H01L 33/32; H01L 2933/0016; G06N 10/00
See application file for complete search history.

(56) References Cited

U.S. PATENT DOCUMENTS

| | | |
|---|---|---|
| 10,084,103 B1 | 9/2018 | Lewis et al. |
| 10,096,744 B2 | 10/2018 | Coe-Sullivan et al. |
| 2014/0294024 A1 | 10/2014 | Kim |
| 2016/0148112 A1 | 5/2016 | Kwon |
| 2018/0294376 A1 | 10/2018 | Tian et al. |
| 2020/0279972 A1 | 9/2020 | Alén Míllán et al. |

FOREIGN PATENT DOCUMENTS

| | | |
|---|---|---|
| JP | 2019-054230 A | 4/2019 |
| JP | 2020-516015 A | 5/2020 |

OTHER PUBLICATIONS

PCT/US2021/063127, International Search Report and Written Opinion dated Aug. 22, 2022, 9 pages.
Javier Martín-Sánchez et al., Strain-tuning of the optical properties of semiconductor nanomaterials by integration onto piezoelectric actuators, published Dec. 6, 2017, 40 pages.

*Primary Examiner* — Savitri Mulpuri
(74) *Attorney, Agent, or Firm* — Patterson + Sheridan, LLP

(57) ABSTRACT

A quantum device includes a substrate including a first material and including an upper surface thereof, a first layer comprising a compound of the first material disposed on the upper surface of the substrate, a second layer, comprising a metal oxide, disposed on the first layer, a third layer, comprising a noble metal, disposed on the second layer, a fourth layer, comprising a metal oxide, disposed on the third layer, a fifth layer, comprising a piezoelectric material, disposed on the fourth layer, a sixth layer, comprising a noble metal, disposed on the fifth layer, a seventh layer, comprising a material capable of quantum emission, disposed on the sixth layer, and an eighth layer, comprising a noble metal, disposed on the seventh layer, and at least one of the eighth layer and the seventh layer are sized to enable quantum emission from the seventh layer.

20 Claims, 13 Drawing Sheets

TUNING OF EMISSION PROPERTIES OF QUANTUM EMISSION DEVICES USING STRAIN-TUNED PIEZOELECTRIC TEMPLATE LAYERS

BACKGROUND

Field

The present disclosure generally relates to the tuning of emission properties of quantum dots by strain-tuning underlying piezoelectric layers for quantum computing and communication. More particularly, the present disclosure relates to precise control over emission properties of single and entangled photons in, for example, photonic quantum communication circuits.

Description of the Related Art

Using quantum dots for large scale photonic quantum computing has a problem of variation in the emission properties of the single and entangled photons emitted by quantum dots, due to the inherent defects in the quantum dot.

SUMMARY

In a first aspect, a quantum device includes a substrate including a first material and including an upper surface thereof, a first layer comprising a compound of the first material disposed on the upper surface of the substrate, a second layer, comprising a metal oxide, disposed on the first layer, a third layer, comprising a noble metal, disposed on the second layer, a fourth layer, comprising a metal oxide, disposed on the third layer, a fifth layer, comprising a piezoelectric material, disposed on the fourth layer, a sixth layer, comprising a noble metal, disposed on the fifth layer, a seventh layer, comprising a material capable of quantum emission, disposed on the sixth layer, and an eighth layer, comprising a noble metal, disposed on the seventh layer, and at least one of the eighth layer and the seventh layer are sized to enable quantum emission from the seventh layer.

In an additional aspect, a method of forming a quantum device includes providing a substrate comprising a first material and including an upper surface thereof, providing a first layer comprising a compound of the first material disposed on the upper surface of the substrate, forming a second layer, comprising a metal oxide, disposed on the first layer, forming a third layer, comprising a noble metal, disposed on the second layer, forming a fourth layer, comprising a metal oxide, disposed on the third layer, forming a fifth layer, comprising a piezoelectric material, disposed on the fourth layer, forming a sixth layer, comprising a noble metal, disposed on the fifth layer, forming a seventh layer, comprising a material capable of quantum emission, disposed on the sixth layer, and forming an eighth layer, comprising a noble metal, disposed on the seventh layer, wherein at least one of the eighth layer and the seventh layer are sized to enable quantum emission from the seventh layer.

DETAILED DESCRIPTION

Figure 1:
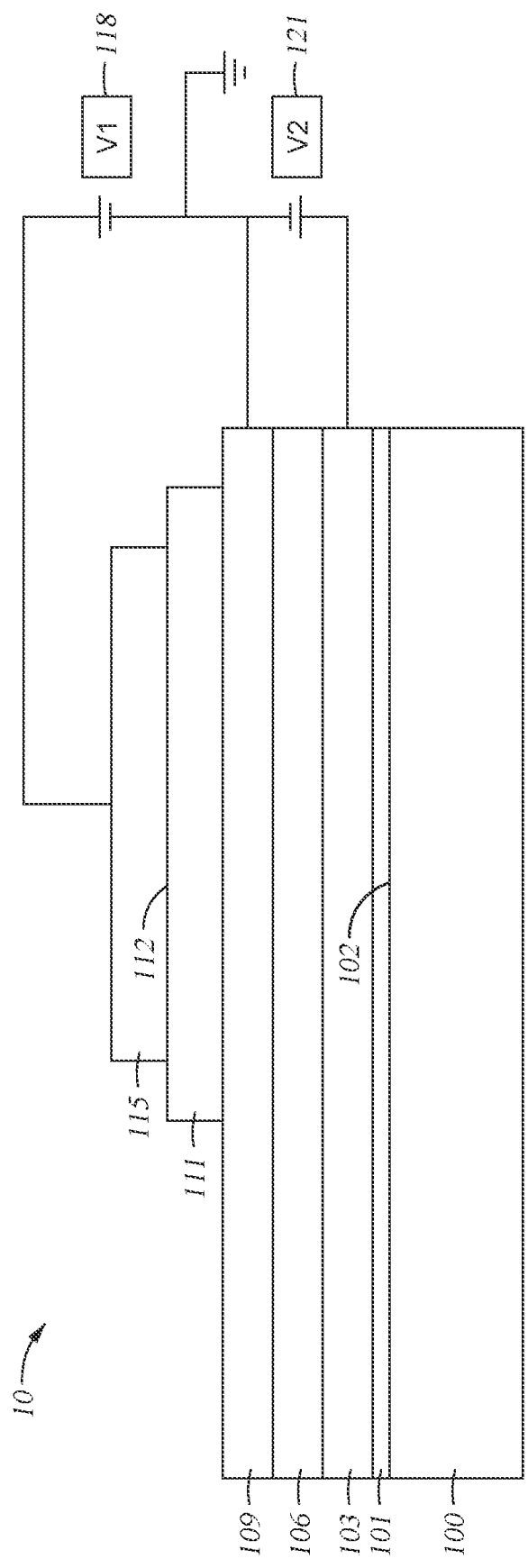
FIG. 1 is a sectional view of a quantum device for strain-tuning a quantum emitter by changing the dimension of an underlying piezoelectric layer to which the quantum emitter is physical operatively connected.

Referring initially to FIG. 1, a schematic side sectional view of a quantum emission device 10 capable of emitting photons of a desired energy and thus a desired wavelength is shown. This device 10 emits photons from a quantum material layer 112 when excited by a voltage potential applied there-across. Here, the device 10 is composed of a single crystal silicon substrate 100 having a SiO2 base layer 101 formed thereon, which in turn is covered with a bottom or first electrode 103, composed of a plurality of conductive thin layers with suitable crystallographic orientation to provide a scaffold for the formation of a piezoelectric layer thereon having suitable crystal orientation, the first electrode 103 here is connected to the positive electrode or voltage terminal of a second source V2 121. This first electrode 103 is coated or covered by a piezoelectric film layer 106 comprising for example PMNPT, PZT, Sc-AlN, or BST. An intermediate, or second electrode 109 is located on top of this piezoelectric film layer 106. The second electrode 109 is connect to the negative or ground potential terminals of the second source V2 and a first source V1. A quantum emission material 111, for example a III-V material such as AlxGa(1−x)N, is located on the second electrode 109. The quantum emission material 111 forming a quantum emission device, here a quantum dot 112, covers only a portion of the second electrode 109. A top, or third electrode 115 is located on the quantum dot 112 and is connected to the the positive electrode or voltage terminal of the first V1 power source 118. Here, the third electrode 115 is shown as being smaller than the planar area of the quantum dot 112. By application of a voltage across the piezoelectric layer 106 resulting in a dimensional change thereof, the dimensions of the third electrode 115 and the underlying quantum dot 112 are changed, and thus the photon energy and resultant frequency of single or entangled photons emitted therefrom can be controllably changed.

The quantum device 10 of FIG. 1 is formed by forming a plurality of film layers over the silicon substrate 100, and patterning the quantum emission material 111 to form the quantum dot 112 therefrom and pattern a third electrode material to form the third electrode 115. As an alternative, as shown in FIG. 2J, the quantum emission material 112 need not be patterned, and the third electrode 115 formed thereover. In this aspect, the size or area of the third electrode 115 contacting the quantum emission material 111 defines the boundaries of a quantum emission device having the size of a quantum dot.

FIGS. 2A to 2J show the results of a series or sequence of process used to form a quantum emission device 10a, similar the quantum emission device 10 of FIG. 1, and FIGS. 3a to 3h show the results of a series or sequence of process used to form a quantum emission device 10 of FIG. 1. Referring initially to FIGS. 2A to 2J, the structure of the quantum emission device 10a is modified from the structure of the quantum emission device 10 of FIG. 1, specifically the quantum emission material 111 extends over a large area, including over the entire area, of the second electrode 109, and the active region of the quantum emission device from which photons or entangled photons are emitted is defined by the overall planar size of the third electrode 115 contacting the quantum emission material 111.

Figure 2A:
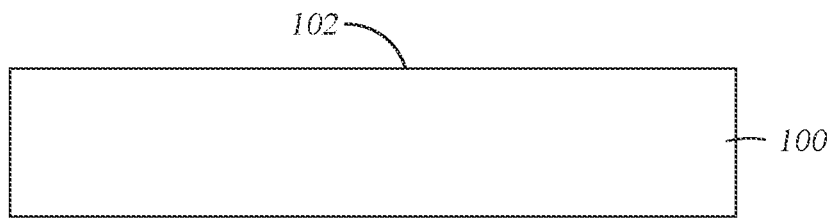
FIG. 2A is a schematic sectional view of a substrate with and on which a quantum device can be formed.
Figure 2B:
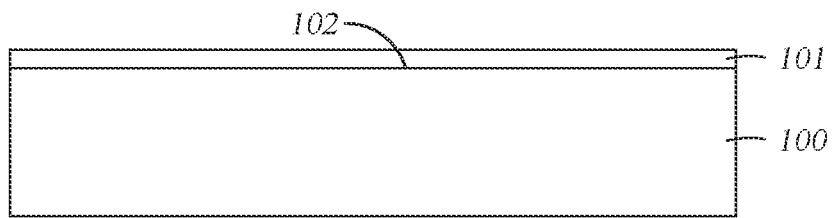
FIG. 2B is a schematic sectional view of the substrate of FIG. 2A with an oxidized top layer
Figure 2C:
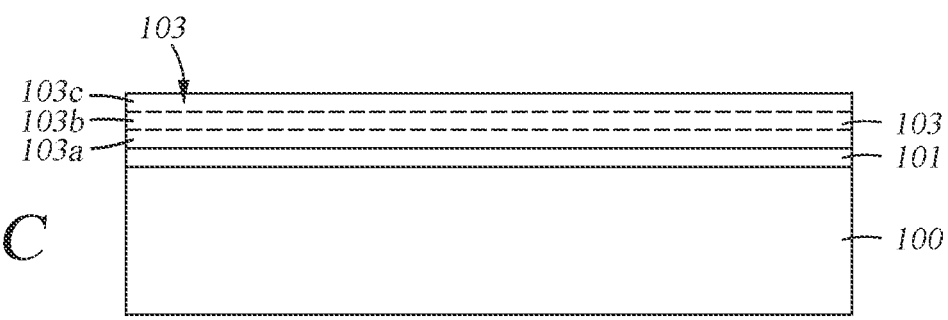
FIG. 2C is a schematic sectional view of the substrate and oxidized top layer of FIG. 2B further including an electrode stack thereon.
Figure 2D:
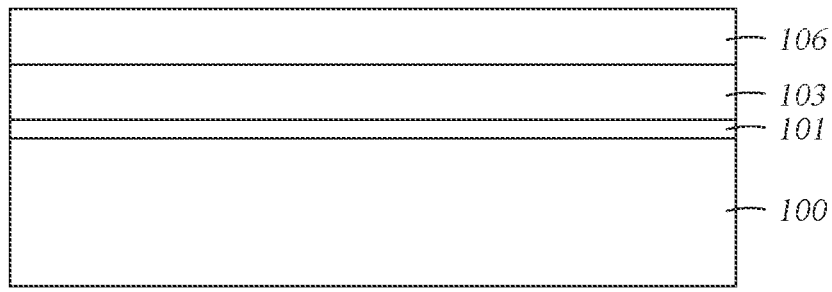
FIG. 2D is a schematic sectional view of the substrate and oxidized top layer and electrode stack of FIG. 2D, further including a piezoelectric layer formed on the electrode stack.
Figure 2E:
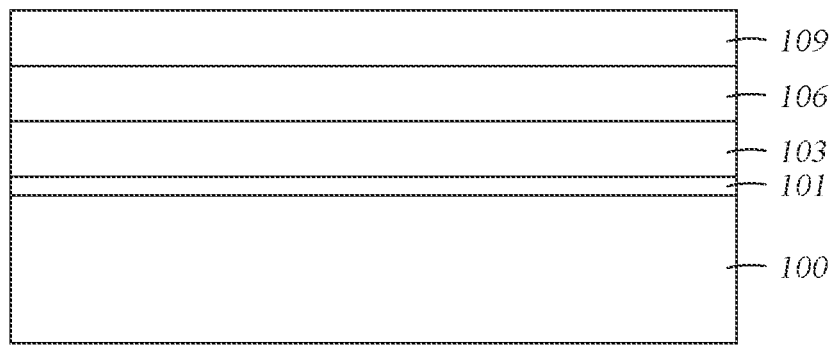
FIG. 2E is schematic sectional view of the substrate of FIG. 2D having an oxidized top layer, an electrode stack, and a piezoelectric layer, further including a second, intermediate, electrode formed on the piezoelectric layer.
Figure 2F:
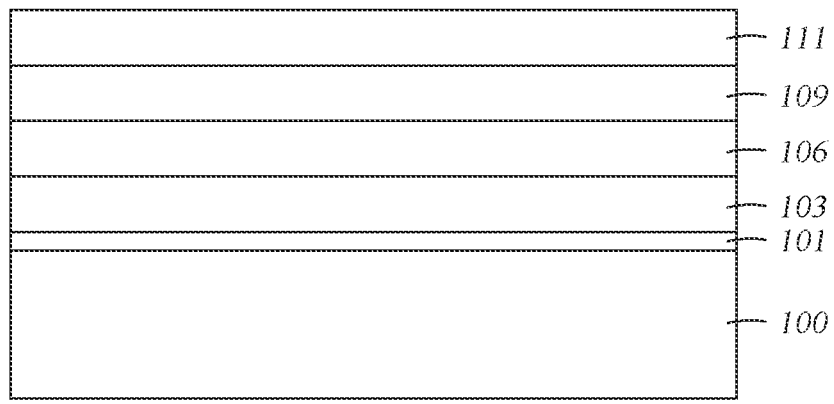
FIG. 2F is a schematic sectional view of the substrate of FIG. 2E having an oxidized top layer, electrode stack, piezoelectric layer and second electrode, with a quantum emission layer formed on the second electrode.
Figure 2G:
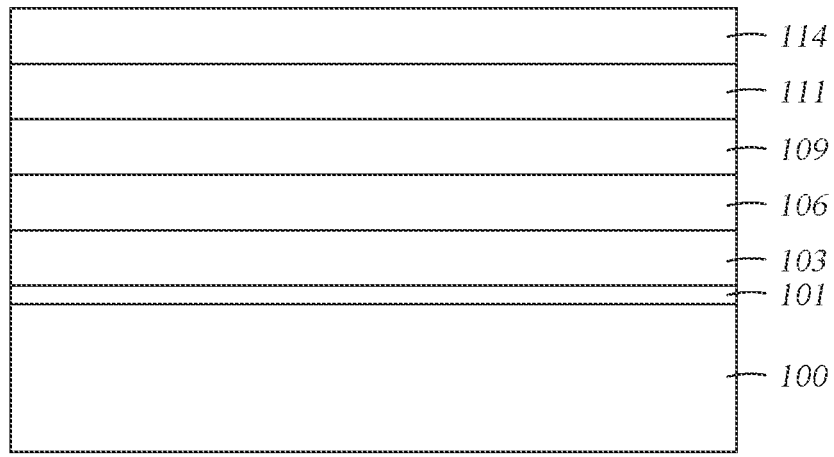
FIG. 2G is a schematic sectional view of the substrate of FIG. 2F having the oxidized top layer, electrode stack, piezoelectric film, second electrode, and quantum emission layer thereon, further including a third electrode material formed on the quantum emission layer.
Figure 2H:
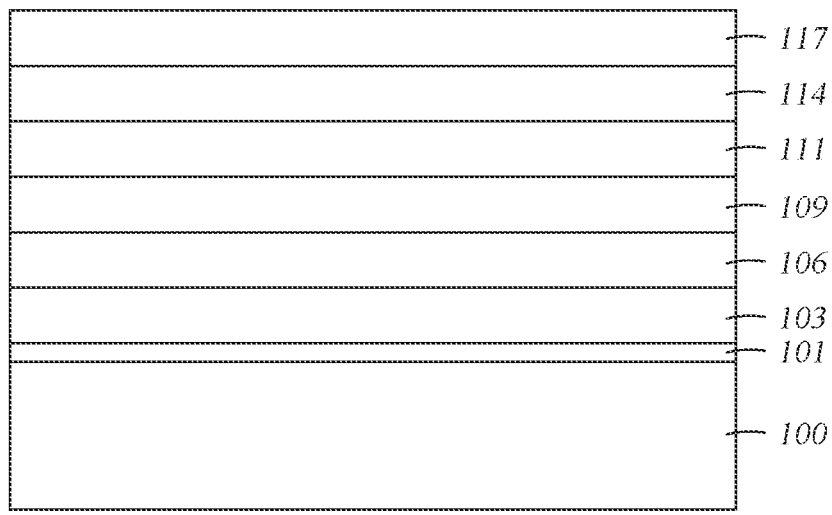
FIG. 2H is a schematic sectional view of the substrate if FIG. 2G having the oxidized top layer, electrode stack, piezoelectric layer, second electrode, quantum emission layer and third electrode material, further including a photoresist material located on the third electrode material.
Figure 2I:
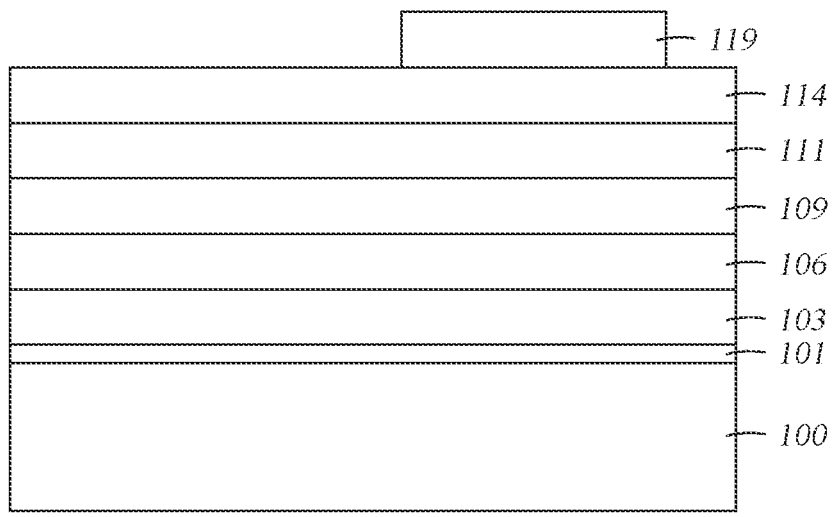
FIG. 2I is a schematic sectional view of the substrate of FIG. 2h having the oxidized top layer, electrode stack, piezoelectric layer, second electrode, quantum emission layer and third electrode material thereon, wherein the photoresist material has been patterned.
Figure 2J:
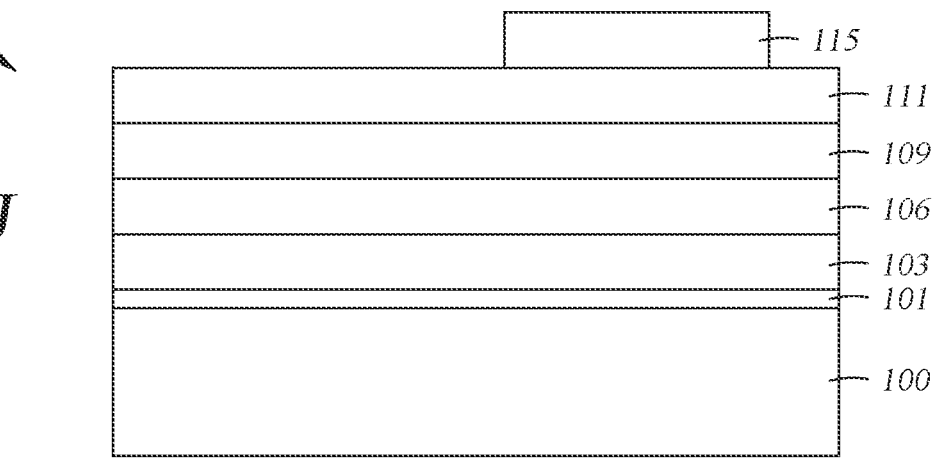
FIG. 2J is a schematic sectional view of the substrate of FIG. 2I having the oxidized top layer, electrode stack, piezoelectric layer, second electrode, and quantum emission layer thereon, wherein the third electrode material has been pattern etched to leave behind a discrete third electrode.
Figure 3A:
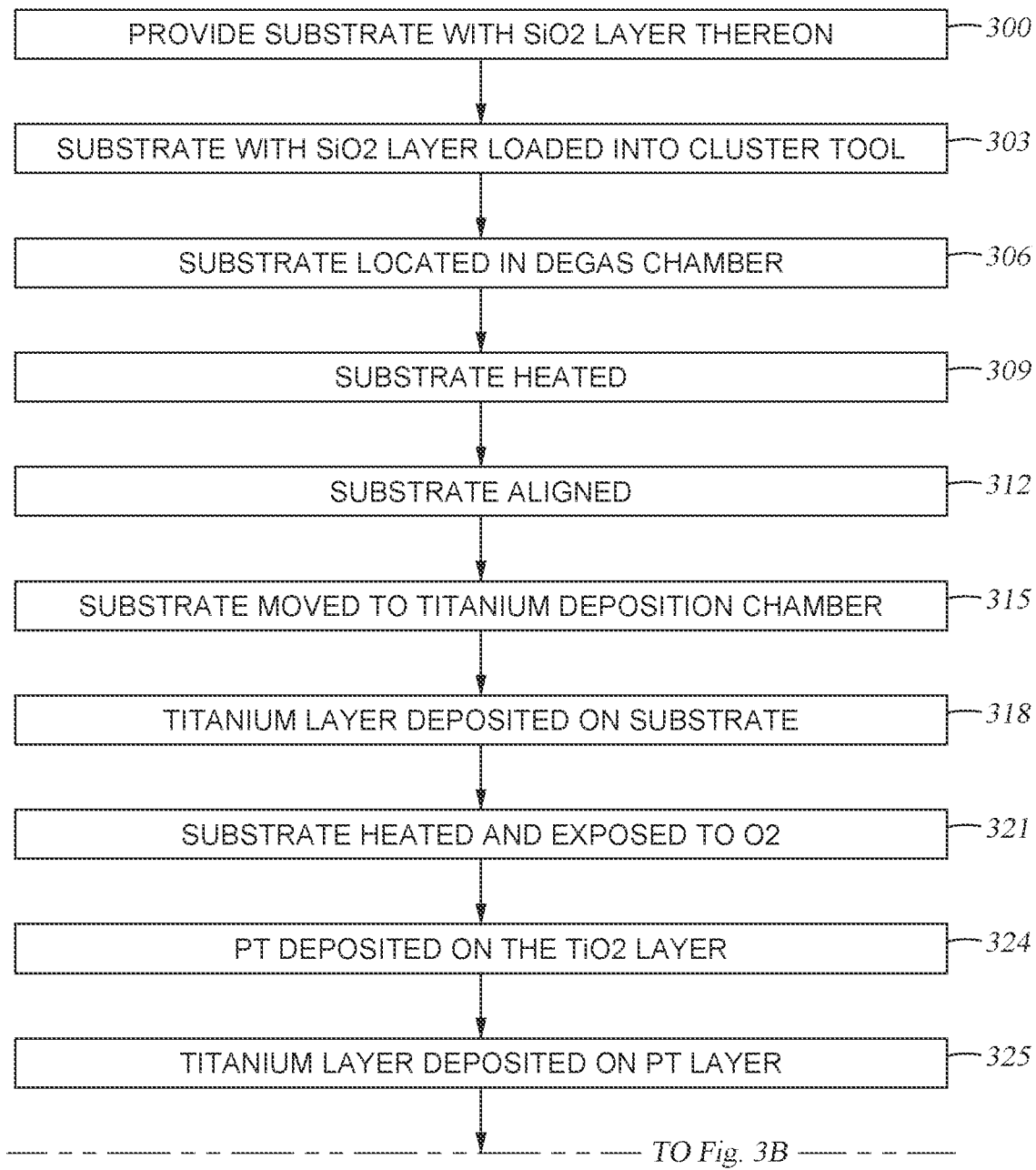
FIGS. 3A and 3B are both one continuous flowchart showing the acts in the manufacture on the device in FIG. 2J.
Figure 3B:
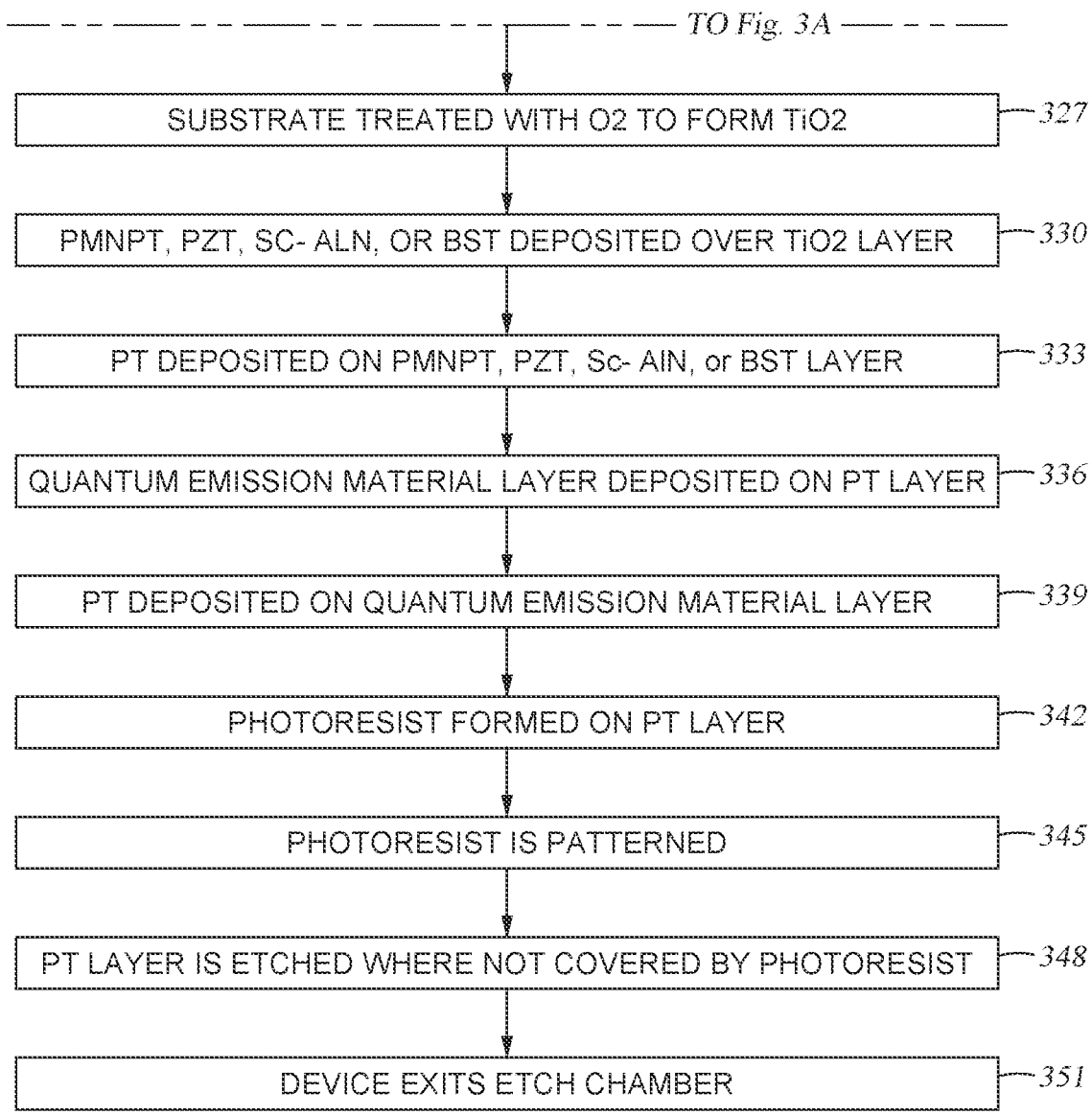
Figure 4A:
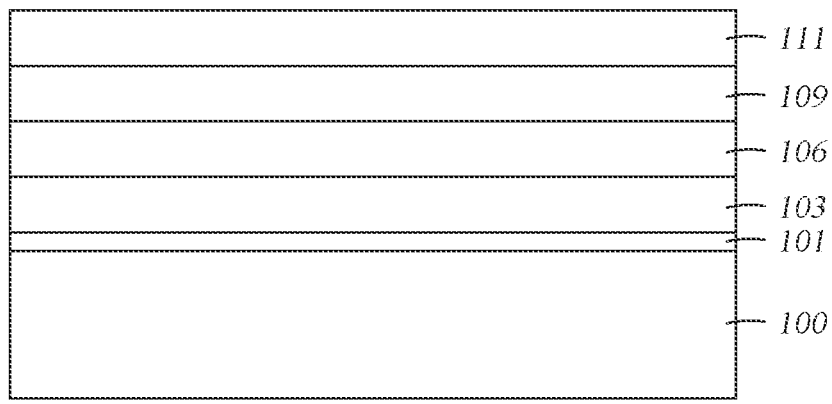
FIG. 4A is a schematic sectional view of substrate having an oxidized top layer, an electrode stack, a piezoelectric layer, a second electrode, and a quantum emission layer thereon, in that order from the substrate to the quantum emission layer.
Figure 4B:
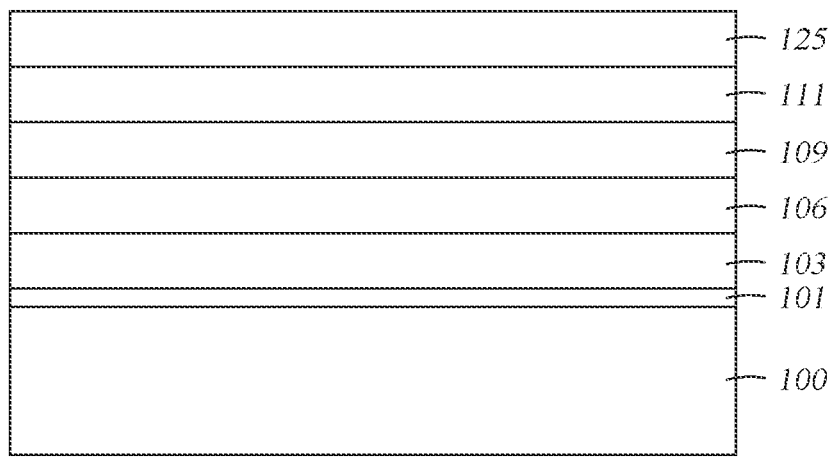
FIG. 4B is a schematic sectional view of the substrate of FIG. 4A having the oxidized top layer, electrode stack, piezoelectric layer, second electrode, and quantum emission layer thereon, further including and a photoresist material formed over and on the quantum emission layer.
Figure 4C:
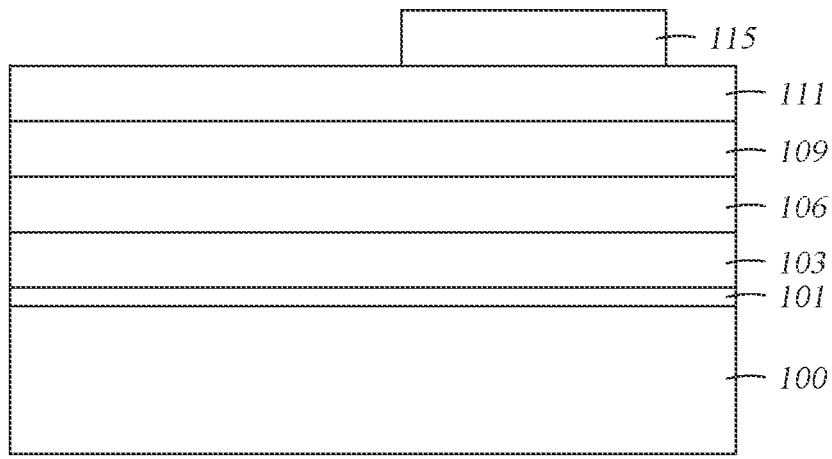
FIG. 4C is a schematic sectional view of the substrate of FIG. 4B having the oxidized top layer, electrode stack, piezoelectric layer, second electrode, and quantum emission layer thereon, wherein the photoresist material of FIG. 4B has been patterned.
Figure 4D:
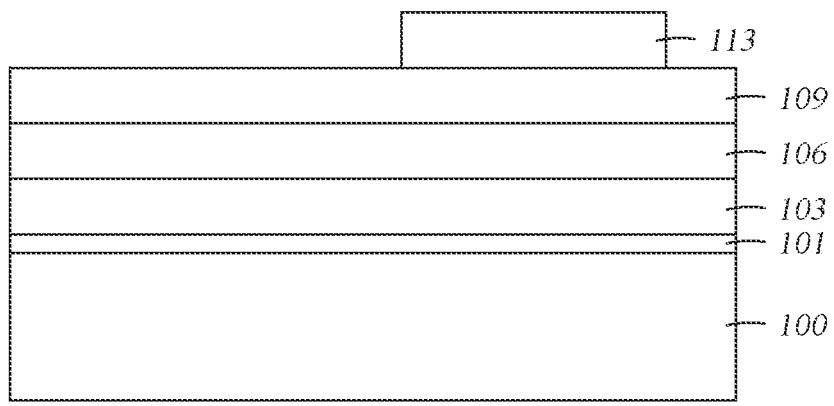
FIG. 4D is a schematic sectional view of the substrate of FIG. 4C having the oxidized top layer, electrode stack, piezoelectric layer, second electrode, wherein the quantum emission layer has been patterned to provide a discrete quantum dot from the quantum emission layer.
Figure 4E:
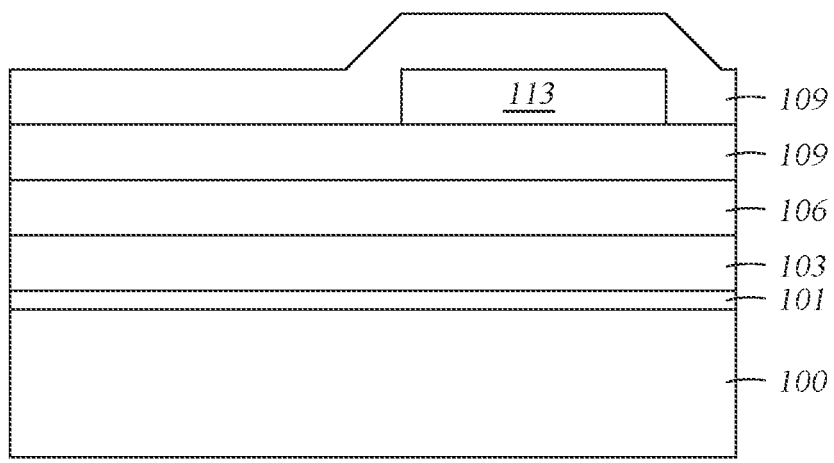
FIG. 4E is a schematic sectional view of the substrate of FIG. 4D having the oxidized top layer, electrode stack, piezoelectric layer, second electrode and a discrete quantum dot thereon, and a third electrode material layer formed thereover.
Figure 4F:
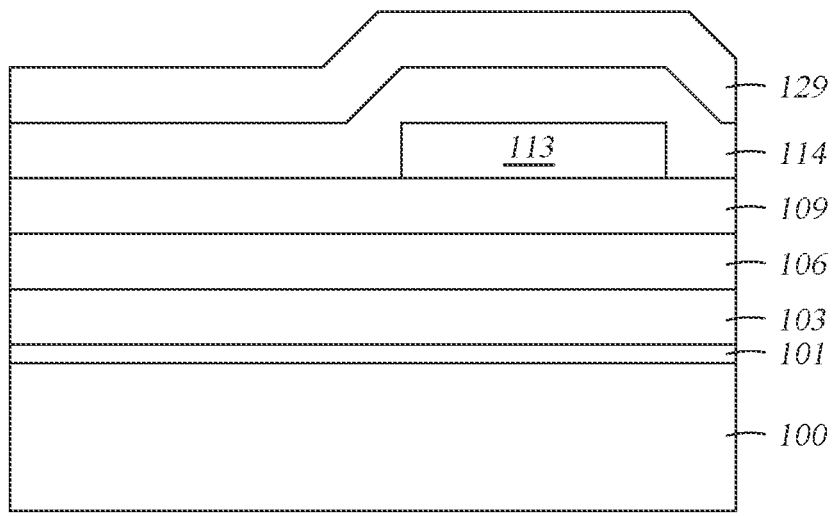
FIG. 4F is a schematic sectional view of the substrate of FIG. 4E, having the oxidized top layer, electrode stack, piezoelectric layer, second electrode, discrete quantum dot and third electrode material layer thereon, with a photoresist layer formed thereover.
Figure 4G:
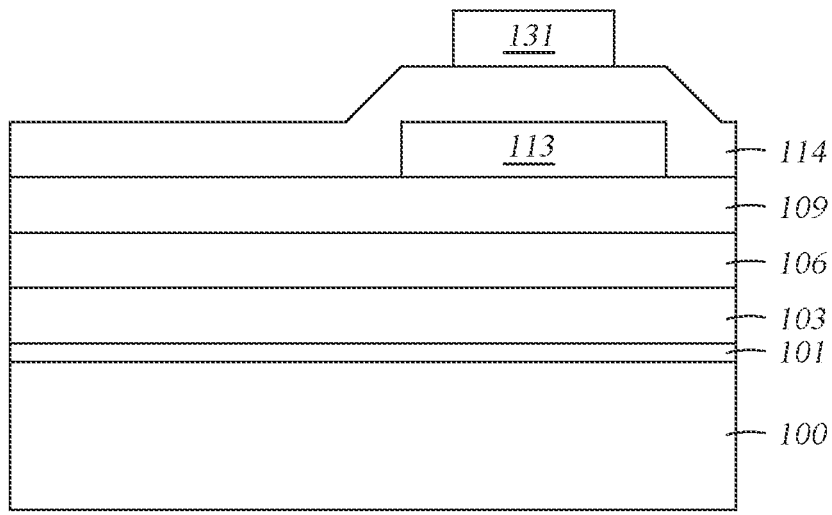
FIG. 4G is a schematic sectional view of the substrate of FIG. 4F having the oxidized top layer, electrode stack, piezoelectric layer, top electrode, discrete quantum dot and top electrode layer thereon, the photoresist layer having been patterned.
Figure 4H:
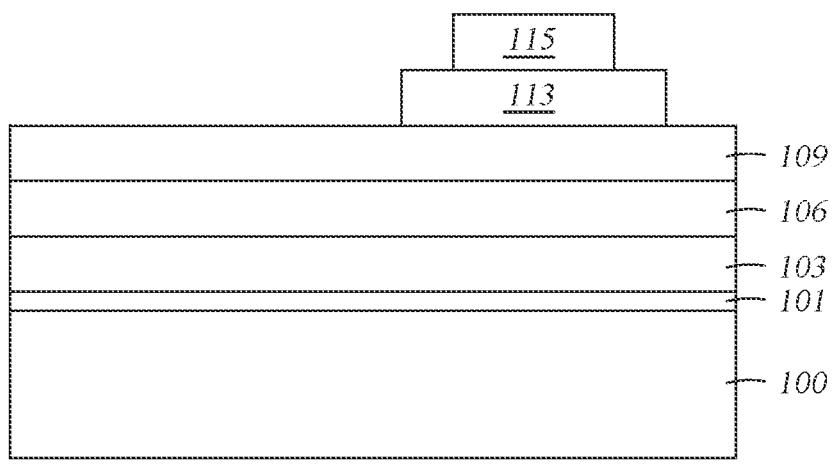
FIG. 4H is a schematic sectional view of the substrate of FIG. 4G, having the oxidized top layer, electrode stack, a piezoelectric layer, second electrode, and discrete quantum dot, wherein the third electrode material layer is patterned etched to provide a discrete third electrode layer.

Initially, as shown in FIG. 2A, a silicon substrate 100, here a single crystal silicon substrate 100, is initially provided. A silicon oxide layer 101 is formed on the upper surface 102 of the substrate 100, such as by heating the substrate 100 and exposing the upper surface thereof to oxygen, for example radicals of oxygen, to convert the exposed upper surface of the silicon of the substrate 100 to silicon oxide to form the silicon oxide layer 101 as shown in FIG. 2B.

A bottom or first electrode stack 103, composed here of three sublayers, is formed over the upper surface 102 of the substrate 100, and thus over the upper surface of the oxide layer 101. The first electrode stack 103 includes a Pt layer interposed between two metal oxide layers, here titanium oxide (TiOx, where the x is between 1.9 and 2.1) layers. In one aspect, a first TIOx layer 103a is formed on the upper surface 101 of the SiO2 layer 102, the Pt layer 103b is formed on the first TiOx layer 103a, and then a third TiOx layer 103c is formed over the Pt layer 103b. Here the first TiOx layer 103a is approximately 25 nm to 50 nm thick, the Pt layer 103b is on the order of 135 nm to 150 nm thick, and the second TiOx layer 103c is on the order of 2 nm thick. Here the first and second TiOx layers 103a,103c are formed by first depositing titanium and then exposing the deposited titanium layer to oxygen while the substrate 100, and thus the titanium layers thereon, are maintained at an elevated temperature of 650° C. For example the oxygen can provided as atomic oxygen or as oxygen radicals supplied by a remote plasma source. The first TiOx layer 103a forms a barrier to migration of Pt from the Pt layer 103b into the SiO2 layer 101 and the Si substrate 100. The second TiOx layer 103c is provided as a seed layer for the piezoelectric layer to be formed thereover. Here each of the first and second TiOx layers 103a, 103c and the Pt layer 103b are formed by sputtering titanium and Pt, respectively, in different physical vapor deposition (PVD) chambers each dedicated to depositing one of Ti or Pt onto the substrate as will be described further herein.

A piezoelectric layer 106 is formed over the upper surface 103c of the bottom electrode stack 103, and thus over the upper surface of the TiOx layer 103c. The piezoelectric layer 106 includes a layer of PMNPT, PZT, Sc-AlN, or BST formed on the upper surface 103c of the bottom electrode stack 103. Here the piezoelectric layer 106 is 100 nm to 5 um thick. Here the PMNPT, PZT, Sc-AlN, or BST layer is formed by sputtering, wherein the substrate 100 with the bottom electrode stack 103 thereon is placed into a PVD chamber wherein a target comprising the piezoelectric layer material, here one of PMNPT, PZT, Sc-AlN, or BST is sputtered such that the upper surface of the substrate 100, i.e., the second TiOx layer 103c of the first electrode 103 receives the layer of PMNPT, PZT, Sc-AlN, or BST deposited thereover to form the piezoelectric layer 106. The piezoelectric layer 106 contains positively and negatively charged domains therein, capable of expansion and contraction when a voltage is imposed thereon or thereacross, thereby influencing the dimensions of quantum material layer 109, as will be described further herein.

A second electrode layer 109 is formed over the upper, exposed, surface of the piezo electric layer 106. The second electrode layer 109 is a Pt layer interposed between the piezoelectric layer 106, here a layer of PMNPT, PZT, Sc-AlN, or BST, and a quantum emission material layer 111 as will be described further herein. The Pt forming the second electrode layer 109 is on the order of 135 nm to 150 nm thick. Here the Pt layer is formed by sputtering Pt in a physical vapor deposition (PVD) chamber onto the substrate as will be described further herein, for example, the same chamber in which the Pt layer 103b was formed.

A quantum emission material layer 111 is formed over the second electrode 109. The quantum emission material layer 111 includes a quantum material capable of, when a small portion thereof is biased thereacross, emitting photons or entangled photons the energy or wavelength of which is based on the area or size of the biased portion, for example III-V material such as AlxGa(1−x)N. This quantum emission material layer 111 is interposed between the second electrode 109, here a Pt layer, and the third electrode 115, the area of which in contact with the quantum emission material layer 111 is selected to cause quantum emission of photons or entangled photons form the portion of the quantum emission material layer 111 between the third electrode 115 and the second electrode 109, as will be described further herein. Here the quantum emission material layer 111 has a thickness on the order of 5 nm to 500 nm. Here the quantum material layer 112 is formed by a CVD, PVD, MOCVD, ALD, or molecular beam evaporation process wherein the substrate 100, with the first electrode 103, piezoelectric layer 106, and second electrode layer 109 thereon is placed into an appropriate deposition chamber and the quantum emission material is deposited on the upper surface of the second electrode layer 109 to form a quantum emission material layer 111 thereover. A portion of the Quantum emission material layer 112 to be subject a bias is isolated in this layer through a variety of possible methods, here by forming a third electrode 115 of a size sufficiently small to cause the portion of the quantum emission material 111 between this third electrode 115 and the underlying second electrode 109 to be excited when a voltage difference is placed on the second and third electrodes 109, 115, such that the portion of the quantum emission material 111 therebetween exhibits quantum emission, i.e., emission of photons or entangled photons based on the area of the quantum emission material layer 111 covered by the third electrode 115 across which the voltage potential is experienced. The quantum emission material allows for differentiation of wavelengths of the photons or entangled photons emitted therefrom by changing the size of the quantum emission material layer 111 across which the voltage potential is experienced by changing the size of the area of the third electrode 115 contacting the quantum emission material layer 111, by expansion or contraction of the piezoelectric layer 106 resulting from a change in the bias applied thereaccross by the first and second electrodes 103,109. By expanding or contracting the piezoelectric layer 106, the layers of the quantum device 10a thereon will likewise contract or expand, with the result that the area or size of the portion of the quantum emission material layer 111 across which the voltage potential is experienced will change, and thus the wavelength of the emissions will also change.

The top or third electrode 115 is formed over and directly on the quantum material layer 112. The top electrode 115 is here a Pt layer on the order of 135 nm to 150 nm thick. The third electrode 115 is here formed by first sputtering Pt from a Pt target in a physical vapor deposition (PVD) chamber and onto the quantum emission material layer 111 to form a third electrode material layer 114. Then a photoresist layer 117 is deposited thereover using a photoresist tool. The photoresist layer is then patterned using standard lithographic techniques, and then developed in the photoresist tool to form a discrete island 119 of developed and cured photoresist on the portion of the surface of the newly deposited third electrode material layer 114, leaving other portions of the third electrode material layer 114 thereabout exposed. The substrate 100 with the first electrode 103, piezoelectric layer 106, second electrode 109, quantum material layer 111, third electrode material layer 114, and photoresist island 119 thereon is placed into an etching device in which the exposed portions of the third electrode material layer 114 is removed, but the portion of the third electrode material layer 114 under the island 119 of photoresist is protected and remains in place to form the third electrode 115. As a result, an isolated and discrete section of the third electrode material layer 114, to form the third electrode 115, remains on the surface of the quantum emission material layer 112. Connecting the first to third electrodes 103, 109 and 115 to appropriate power sources 118, 121, as shown in FIG. 1, results in a quantum emission device 10a. For example, by connecting the second electrode 109 to a reference potential of or ground, and connecting the positive terminal of the scorn power supply 121 to the first electrode, a bias may be applied across the piezoelectric layer 106. Simultaneously, connecting the third electrode 115 to the positive output terminal of the first power supply 118, with the reference or negative terminal of the first power supply 118 to ground or to the reference potential of the negative terminal of the second power supply 122, bias can be applied across the quantum emission material between the portion of the quantum emission material 111 between this third electrode 115 and the underlying second electrode 109 separately and independently of the voltage across the piezoelectric layer 106, thereby allowing independent control of emission by the first power supply 118, and the size of the portion of the quantum emission material 111 between this third electrode 115 and the underlying second electrode 109 using the bias of the second power supply 122.

Figure 6:
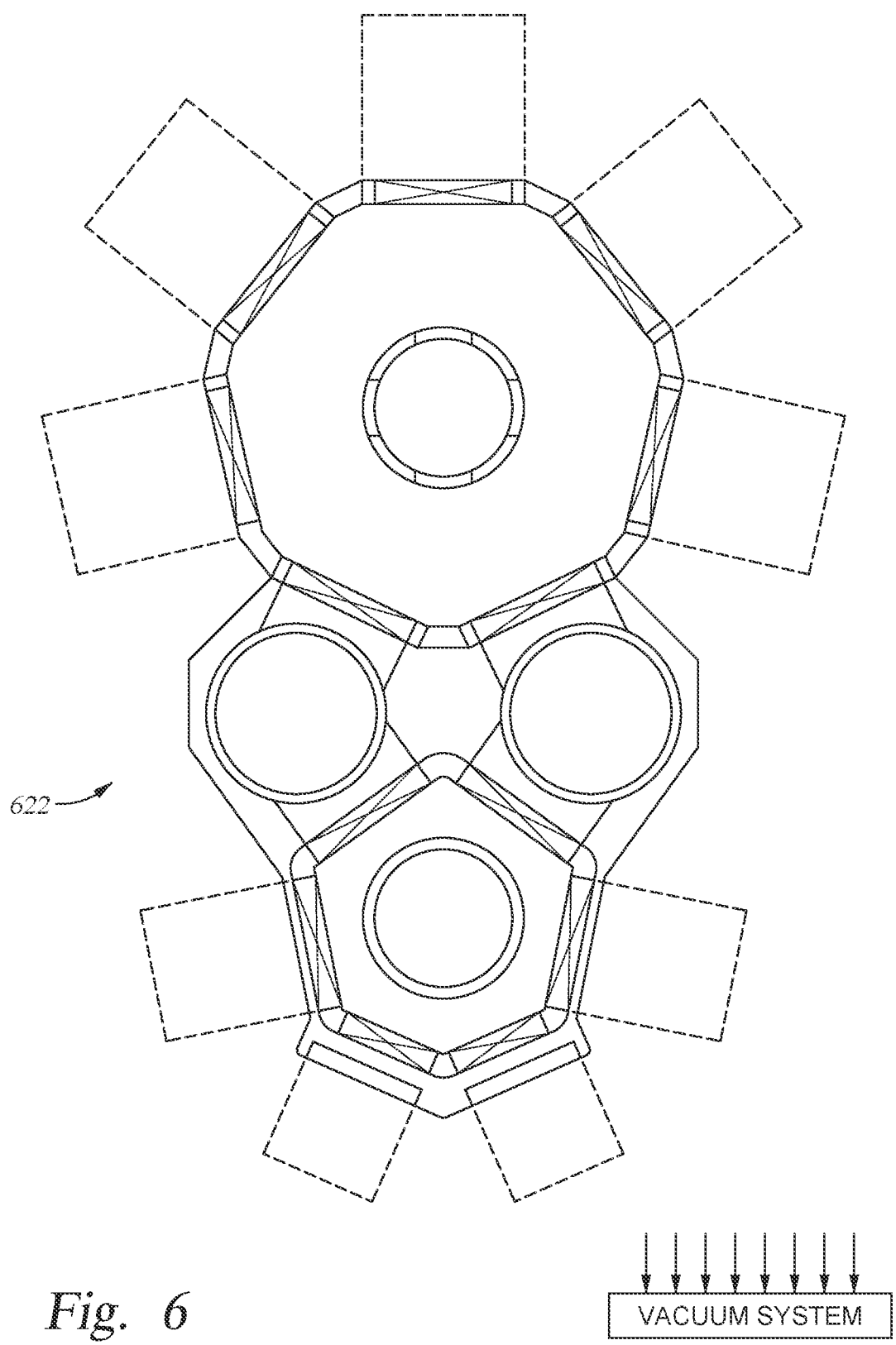
FIG. 6 is a plan view of an illustrative cluster tool useful in forming the layers of the devices shown in FIGS. 2J and 4H.

The deposited layers of the quantum device 10a, as well as of the quantum device 10 of FIG. 1, may be formed in a single processing system, such as a cluster tool 600 as depicted in schematic plan view in FIG. 6. Cluster tool 600 here includes a first transfer chamber 602 including therein a robotic wafer handler (not shown), and a second transfer chamber 604 likewise including therein a robotic wafer handler (not shown), the transfer chambers 602, 604 connected together by a pair of pass through chambers 606, 608.

A plurality of process chambers capable of performing one or more processes on a substrate such as substrate 100 loaded thereinto from one of the first and second transfer chambers 602, 604 are connected to individual facet locations on the outer surface of the cluster tool 600. To form the deposited layer of the quantum devices 10, 10a, the cluster tool 600 includes a degas and orienting chamber 610 and a preclean chamber 611, each connected to a facet along the first transfer chamber 602, and at least one titanium deposition chamber 614, at least one platinum deposition chamber 616, at least one quantum emission material deposition chamber 612 and at least one piezoelectric material deposition chamber 618 each connected to a facet along the second transfer chamber 604, Additionally, an oxidation chamber 626 may be provided, here on a facet of the second transfer chamber 604.

To enable loading, and unloading, of substrates into and from the cluster tool 600, a pair of loadlock chambers 620, 622 are provided, each connected to a facet of the first transfer chamber 602. Each of the loadlock chambers 620, 622, the preclean chamber 611 and the degas and orienting chamber are connected to the interior volume of the first transfer chamber 602 through a slit valve 624, and each of the piezoelectric deposition chamber 616, oxidation chamber 618, titanium deposition chamber 614, a quantum material deposition chamber 612, and platinum deposition chamber 616 are likewise connected to the interior volume of the second transfer chamber 604 through a slit valve 624. Slit valves 624 are configured to selectively open to allow substrate transfer as between a chamber and the connected transfer chamber thereto, and close and seal off the interior volume of the transfer chamber from the interior volume of the respective process chamber.

Each of the first and second transfer chambers 602, 604, are pumped by vacuum pumps to enable maintenance of a vacuum level pressure therein, for example, on the order of 10-7 to 10-7 torr. Each of the process chambers, here degas and orienting chamber 610, preclean chamber 611, quantum material deposition chamber 612, titanium deposition chamber 614, platinum deposition chamber 616, piezoelectric material deposition chamber 618 and oxidation chamber 618 are also maintainable at a vacuum level pressure, and each has one or more vacuum pumps (not shown) dedicated thereto. The loadlock chambers 620, 622, are also connected to a vacuum pump. The loadlock chambers 622, 624 each include an outer access door which is openable and sealably closeable to seal the interior thereof from the outside ambient pressure, and a vacuum pump is provided to lower the pressure in the loadlock chambers 620, 622 to that of the first transfer chamber 602 before the slit valves 624 connecting them to the first transfer chamber is opened. Thus, each chamber on the cluster tool is environmentally isolatable from every other chamber thereon, and each process chamber and transfer chamber is connected to a separate vacuum pump or pumps to lower, and maintain, a desired pressure therein. Thus, a substrate receiving a material layer thereon, or having been degasses, precleaned, or both, can be placed in another process chamber without the substrate, and the layers exposed thereon, being exposed to the atmospheric air environment on the exterior of the system.

Referring now to FIG. 3, a method for manufacturing the quantum device device 10a of FIG. 2 J is described. Initially, in Act 300, a substrate, having an SiO2 layer thereon, is provided as a pre-device. In Act 303, the substrate 100 having been previously oxidized, is placed into a cluster tool, such as cluster tool 600, by loading the substrate into the first loadlock 620 thereof. At act 306, the substrate 100 is moved from the loadlock chamber 620 and moved through the first transfer chamber 602 by the robotic handler therein and is placed into degas and orienting chamber 610 and heated to drive off any moisture or other volatiles as gases, i.e., degassed, and aligned such that any notch or other feature thereon is properly aligned for placement on the substrate supports of the various chambers of the cluster tool 600. Once the substrate 100 has been degassed and oriented, it is ready for material layers to form the quantum device 10a to be deposited thereon. Initially at Act 315 the substrate is moved from the degas and orienting chamber 610 and passed by the robotic handler in the first transfer chamber 620 to one of the pass through chamber 606, 608, and then moved by the robotic handler in the second transfer chamber 604 into the titanium deposition chamber 614 and placed on the substrate support therein. Then, in Act 315 a layer of titanium is deposited onto the upper surface 102 of the substrate 100, here on the upper surface of the silicon oxide layer 101 formed on the substrate 101 prior to the loading thereof into one of the loadlock chambers 260, 622. In Act 315, the titanium layer is formed, such as by sputtering a titanium target in the titanium deposition chamber 614 and depositing the sputtered titanium flux on the substrate upper surface 102, and then the substrate 100 is heated, in an oxygen environment, to convert the titanium layer into first titanium oxide layer 103a. This is here accomplished, in Act 312, by introducing a gaseous oxygen or gaseous oxygen radicals into the titanium deposition chamber 614, or by transferring the substrate into to the oxidation chamber 626, where the substrate is heated in a gaseous oxygen or gaseous oxygen radical environment to convert the titanium thereon into titanium nitride. As a third alternative, the first titanium nitride layer 103a can be formed by sputtering the titanium target in a gaseous plasma environment which includes oxygen, such that the sputtered flux of titanium and oxygen combine to form the first titanium nitride layer 103 a on the upper surface 102 of the substrate 100.

Here, the first electrode is a trilayer structure, composed of a platinum layer 103b between two titanium oxide 103a, 103c layers. Thus, the substrate 100, with the first titanium oxide layer 103a formed thereon, is now moved into the platinum deposition chamber 116, where at act 324 Pt is deposited on the first TiOx layer 103a to form the platinum layer 103b. Platinum deposition chamber 616 is also a PVD chamber, such that platinum is sputtered from a platinum target therein, to form the platinum layer 103b over the first titanium oxide layer 103a. Then, at Act 325, the substrate 100 is moved from the platinum deposition chamber 616 back into the titanium deposition chamber 614, where a second titanium layer is sputter deposited thereon, and then oxidized in the same manner as described herein to the formation of the first titanium oxide layer 103a, for example, at act 327, being oxidized by exposure to oxygen, to form the second titanium oxide layer 103c. At Act 330 the substrate 100 is moved, by the robotic handler of the second transfer chamber 604, into the piezoelectric layer deposition chamber 616, and one or more of PMNPT, PZT, Sc-AlN, or BST are deposited over the second titanium oxide layer 103c. The PMNPT, PZT, Sc-AlN, or BST are here sputtered from a target of that same composition and deposited on the second titanium oxide layer 103c in the piezoelectric deposition chamber 618.

Then, at Act 333 the substrate 100 with the PMNPT, PZT, Sc-AlN, or BST layer 106 thereon is moved back to the platinum deposition chamber 616 and is covered with a layer of Pt deposited thereon to form the second electrode 109 of the quantum device 10a. At Act 336 the Pt layer is covered with a quantum dot material, for example AlxGa(1−x)N deposited thereon. This is performed by moving the substrate from the platinum deposition chamber 616, using the substrate handling device in the second transfer chamber, to one of the pass through chambers 606, 608, where it is picked up by the substrate handling device of the first transfer chamber 602 and loaded into the quantum material deposition chamber 612 for deposition of the quantum material, for example, thereon. Then at Act 339, the substrate is moved back through the first transfer chamber, 602, one of pass through chambers 606, 608, and the second transfer chamber 604, and into platinum deposition chamber 616 where a layer of Pt, is deposited thereon by using PVD, i.e., is sputtered thereon from a sputtering target.

The entire upper surface of the substrate 10 is now covered with the plurality of layers deposited as described. To form individual quantum devices such as device 10a, the area of the quantum material layer 112 on which a voltage potential is applied across must be sufficiently small to emit photons when the voltage is applied, and the energy (wavelengths) of those photons must be tunable. Here, in quantum device 10a, rather than pattern the quantum mission material to form a discrete "dot" of quantum material, the top or third electrode material, i.e., the final platinum layer, is patterned to form an electrode of the size required for the portion of the quantum emission material layer across which the voltage is applied between the intermediate and third electrodes to emit photons of the desired wavelengths.

Thus, the substrate, with the aforementioned layers thereon, is removed from the cluster tool 600, and at Act 342, a photoresist layer is formed over the third electrode material, such as by spin coating thereon followed by baking thereof. Then, the photoresist covered substrate is moved to a stepper and pattern exposed at act 345, and then the substrate 100 is moved back to the photoresist tool and developed, such that a discrete island of photoresist remains on the surface of the Pt layer to cover the Pt layer at the location where the third electrode 115 is to be formed. At Act 348, the top layer of the pre device 10a' is etched within an etching tool, that is, the exposed portion of the platinum layer is removed through etching, leaving only the protected area of the platinum layer, and thus the third electrode 115, discretely thereon. At Act 351, the finished device 10 exits the etching device.

Referring now to FIGS. 4A to 4H, the results of a series or sequence of process, used to form a quantum dot device 10, are shown. Here, the structure of the quantum dot device 10 pertains to the structure of the quantum dot device 10 of FIG. 1, specifically the quantum emission material 111 extends over a discrete limited area of the quantum emission material facing surface of the second electrode 109, and thus a quantum dot 113 is defined by a discrete area within the overall planar size of the third electrode 115.

Here, the substrate 100 with the first electrode 103, piezoelectric layer 106, intermediate or second electrode layer 109, and quantum emission material layer 111 thereon, is provided, as described herein with respect to FIGS. 2A to 2F. The second through sixth layers, here the first electrode 103, piezoelectric layer 106, intermediate or second electrode layer 109, and quantum emission material layer 111 thereon, encompass a piezoelectric stack. Then a first photoresist layer 125 is deposited thereover using a photoresist tool. The first photoresist layer 125 is then patterned using standard lithographic techniques, and then developed in the photoresist tool to form a first discrete photoresist island 127 on a portion of the surface of the newly deposited quantum emission material layer 111, leaving the portions of the top quantum material layer thereabout exposed. The substrate 100 with the bottom electrode stack 103, piezoelectric layer 106, second electrode layer 109, quantum material layer 111, and discrete photoresist island 127, is placed into an etching device in which the exposed quantum mission material of the quantum emission material layer is removed, but the portion under the island 127 of photoresist is protected and remains in place to form the quantum material layer as a quantum dot 113.

The top or third electrode 115 is then formed over and directly on the quantum dot 113 and the exposed surface of the second electrode layer 109. The third electrode layer 114 includes a Pt layer on the order of 135 nm to 150 nm thick. The third electrode layer 114 is here formed by sputtering Pt from a Pt target in a physical vapor deposition (PVD) chamber and onto the quantum dot 113 and exposed second electrode layer 109. Then a second photoresist layer 129 is deposited thereover using a photoresist tool. The second photoresist layer 129 is then patterned using standard lithographic techniques, and then developed in the photoresist tool to form a second discrete photoresist island 131 on the portion of the surface of the newly deposited Pt third electrode material layer 114, leaving the portions of the third electrode material layer 114f thereabout exposed. The substrate 100 with the first electrode stack 103, piezoelectric layer 106, second electrode layer 109, quantum dot 113, top electrode material layer 114, and the second discrete photoresist island 129, is placed into an etching device in which the exposed Pt material of the third electrode material layer 114 is removed, but the portion under the island of photoresist is protected and remains in place to form the third electrode 115. As a result, an isolated and discrete section of the third electrode material to form the third electrode 115 remains on the surface of the quantum dot 113, but does not contact the second electrode layer 109. Connecting the first, second and third electrodes 103, 109 and 115, to appropriate power sources, as shown in FIG. 1 and discussed with respect to the quantum device 10a, results in an operable quantum dot device 10a.

Figure 5:
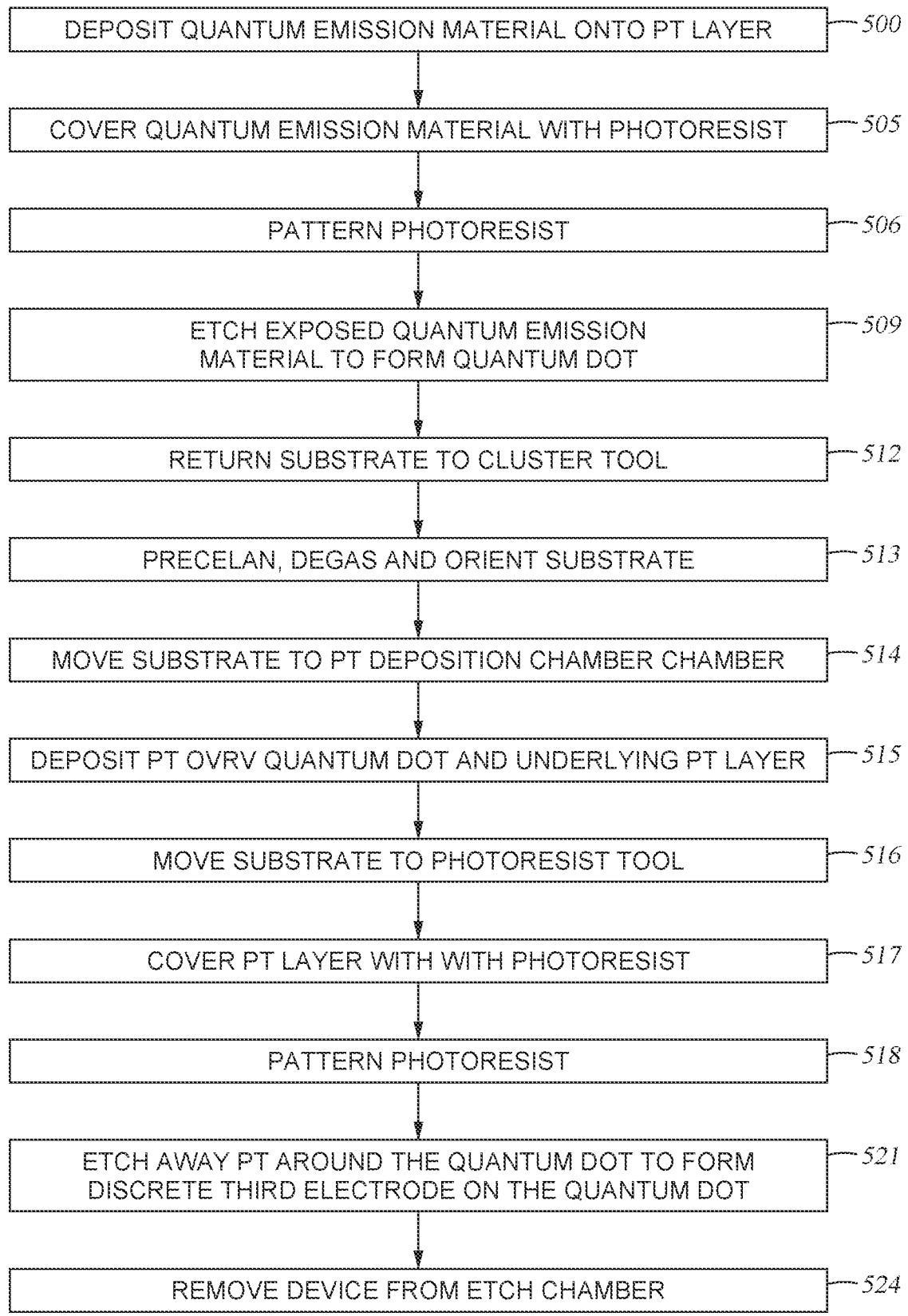
FIG. 5 is a flowchart showing the acts in the manufacture on the device in FIG. 4H.

Referring now to FIG. 5, a method for manufacturing a quantum device 10 of FIG. 1 is described. In Act 500, the substrate 100 with the first electrode 103, piezoelectric layer 106, second electrode layer 109, and quantum emission material layer 111, for example III-V material such as AlxGa(1−x)N within a cluster tool 600, is placed into a photoresist coating device. At Act 503 a photoresist layer is formed over the quantum material, such as by spin coating the photoresist thereon followed by baking thereof. Then, the photoresist coated substrate is moved to a stepper and pattern exposed at Act 506, and then the substrate 100 is moved back to a photoresist tool and developed, such that a first discrete island 127 of photoresist remains on the surface of the quantum emission material layer to cover the quantum emission material layer at the location where the third electrode 115 is to be formed. At Act 509, the exposed portion of the quantum emission material layer 111 is etched within an etch tool, that is, the exposed portion of the quantum emission material layer is removed through etching, leaving only the protected area of the quantum emission material layer 111 under the first photoresist island 127, and thus the portion of the quantum emission material layer 111 thereunder, discretely thereon, of a size sufficiently small to function as quantum dot 113. Then at Act 512, the substrate 100 is moved back to the cluster tool 600 through the first transfer chamber 602, one of pass through chambers 606, 608, and the second transfer chamber 604, and into platinum deposition chamber 616 where a layer of Pt is deposited thereon by using PVD, i.e., is sputtered thereon from a sputtering target.

The substrate 100, with the aforementioned layers thereon, is removed from the cluster tool 600, and placed again in the photoresist tool at Act 516. At Act 517 a photoresist layer is formed over the third electrode material, such as by spin coating a second photoresist layer thereon followed by baking thereof. Then, the photoresist covered substrate 100 is moved to a stepper and pattern exposed at act 518, and then the substrate 100 is moved back to a photoresist tool and developed at Act 519, such that a second discrete island 131 of photoresist remains on the surface of the Pt layer to cover the Pt layer at the location where the third electrode 115 is to be formed directly over the quantum dot 113 of quantum emission material. At Act 521, the third electrode layer 114 is etched within an etching tool, that is, the exposed portion of the platinum layer is removed through etching, leaving only the protected area of the platinum layer, and thus the third electrode 115, discretely thereon. At Act 524, the finished device 10 exits the etching device.

FIG. 6 is a schematic top plan view of the configuration of a multiple chamber, staged vacuum wafer processing system 620. The system 620 shown in FIG. 6 includes a housing 622 which defines four main chamber areas: a robot buffer chamber 624 at one end, a transfer robot chamber 628 at the opposite end, and a pair of intermediate processing or treatment chambers 626 and 627. Although one or more load-lock chambers 621 may be used, preferably two such chambers 621 are mounted to the robot buffer chamber 624, and are in communication with the interior of the buffer robot chamber 624 via access ports 636a and associated slit valves 638a. A plurality of vacuum processing chambers 634 (illustratively five) are mounted about the periphery of the transfer robot station 628. The vacuum processing chambers 634 may be adapted for various types of processing, including etching and/or deposition processes. Access from intermediate processing or treatment chambers 626 and 627 to transfer robot chamber 628 is provided via access ports 636b and associated slit valves 636b. Access is provided to and between each of the chambers 634 and transfer robot chamber 628 through a gate valve 640.

In more detail, the buffer chamber 624 and transfer robot chamber 628 communicate with one another via the intermediate processing or treatment chambers 626 and 627 (also called "treatment chambers"). Specifically, intermediate treatment chamber 626 is located along a corridor or pathway 630 which connects the transfer robot chamber 628 to the buffer robot chamber 624. Similarly, the second intermediate treatment chamber 627 is located along a separate corridor or pathway 632 which connects transfer robot chamber 628 with buffer robot chamber 624. These separate paths between the two robot or transfer chambers 624, 628, permit one path to be used for loading or unloading while the system is being used for wafer processing and, thus, provide increased wafer throughput. Please note that chambers 626 and 627 can be dedicated to pre-treatment (e.g., plasma etch cleaning and/or heating) of the wafers before processing in chambers 634 or post-treatment (e.g., cool-down) of the wafers following treatment in chambers 634. Alternatively, one or both of the chambers 626 and 627 can be adapted for both pre-treatment and post-treatment.

Preferably, the housing 622 is a monolith, i.e., it is machined or otherwise fabricated from one piece of material (such as aluminum) to form the four chamber cavities 624, 626, 627, and 628, and the interconnecting corridors or pathways 630 and 632. The use of the monolith construction facilitates alignment of the individual chambers for wafer transport and also eliminates difficulties in sealing the individual chambers.

One typical operational cycle of wafer transport through the system 620 is as follows: Initially, an RΘ buffer robot 640 in chamber 624 picks up a wafer from a cassette load-lock 621 and transports the wafer to a chamber 626, which illustratively etch cleans the surface of the wafer. An RΘ transfer robot 642 in chamber 628 picks up the wafer from the pre-cleaning chamber 626 and transfers the wafer to a selected one of the preferably high-vacuum processing chambers 634. Following processing, transfer robot 642 can transfer the wafer selectively to one or more of the other chambers 634 for processing. Then, following use of this random access-type transfer capability, the transfer robot 642 transfers the wafer to intermediate processing chamber 627, which illustratively is a cool-down chamber. After the cool-down cycle, buffer robot 640 retrieves the wafer from the chamber 627 and returns it to the appropriate cassette load-lock chamber 621.

As alluded to above, the system 620 is uniquely designed so that each chamber stage (main processing chambers 634/transfer robot chamber 624/intermediate processing chambers 626 and 627/buffer robot chamber 624/load-lock chambers 621) can be isolated from all the other chambers. None of the chambers or stages, with the exception of the cassette load-lock(s) 621, is vented to atmosphere during processing. In addition, during wafer transfer, only two adjacent chambers need to be in communication at any time. As a result, variations in vacuum level and, specifically, reductions in the vacuum level during wafer transfer can be minimized by using a vacuum pumping system 650 to provide a vacuum gradient across the system from the cassette load-lock 621 to the vacuum processing chambers 634. The staged vacuum is applied across the system, with the degree of vacuum increasing in order from the cassette load-locks 621 to the processing chambers 634. Consequently, the time required to pump down chamber 634 to its base vacuum level subsequent to the loading of a wafer therein is minimized, and very high degrees of vacuum can be used in the processing chambers 634 without lengthy pump-down times and, thus, without adversely affecting system throughput. Also, since the wafers can be precleaned and/or pre-heated before entering high vacuum, there is less system contamination and throughput is increased.

In addition to the enhanced vacuum isolation, throughput, and processing versatility provided by an intermediate stage chamber of the kind illustrated as 626 and 627, the above-mentioned stations or chambers 644 and 646 can be mounted on the buffer robot chamber 624 to provide still additional processing isolation, flexibility, and throughput enhancement. For example, chamber 644 may be an orienter which is used to orient the wafer flats prior to processing. Alternatively, an entire cassette of wafers in load-lock chamber 621 may be oriented one at a time preparatory to transfer to the processing chambers. Chamber 646 may also be dedicated to pre-processing treatment. Alternatively, one or both of the chambers 644 and 646 may be used for post-processing treatment, for both pre-processing and post-processing treatment, or for processing itself. These chambers 644 and 646 are very effectively isolated from the processing chambers 634 by the intervening individually isolated buffer chamber 624, transport paths 626 and 627 (and associated chambers), and transfer chamber 628. Thus, chambers 644 and 646 can be conveniently used for processes which require a different (and/or incompatible) chemistry and/or different (typically lower) pressure relative to the group of processing chambers 634. For example, the high degree of isolation facilitates the use of corrosive gas chemistry in the chambers 634 without affecting the atmosphere and processing/treatment in the chambers 644, 646, and vice versa.

Figure 7:
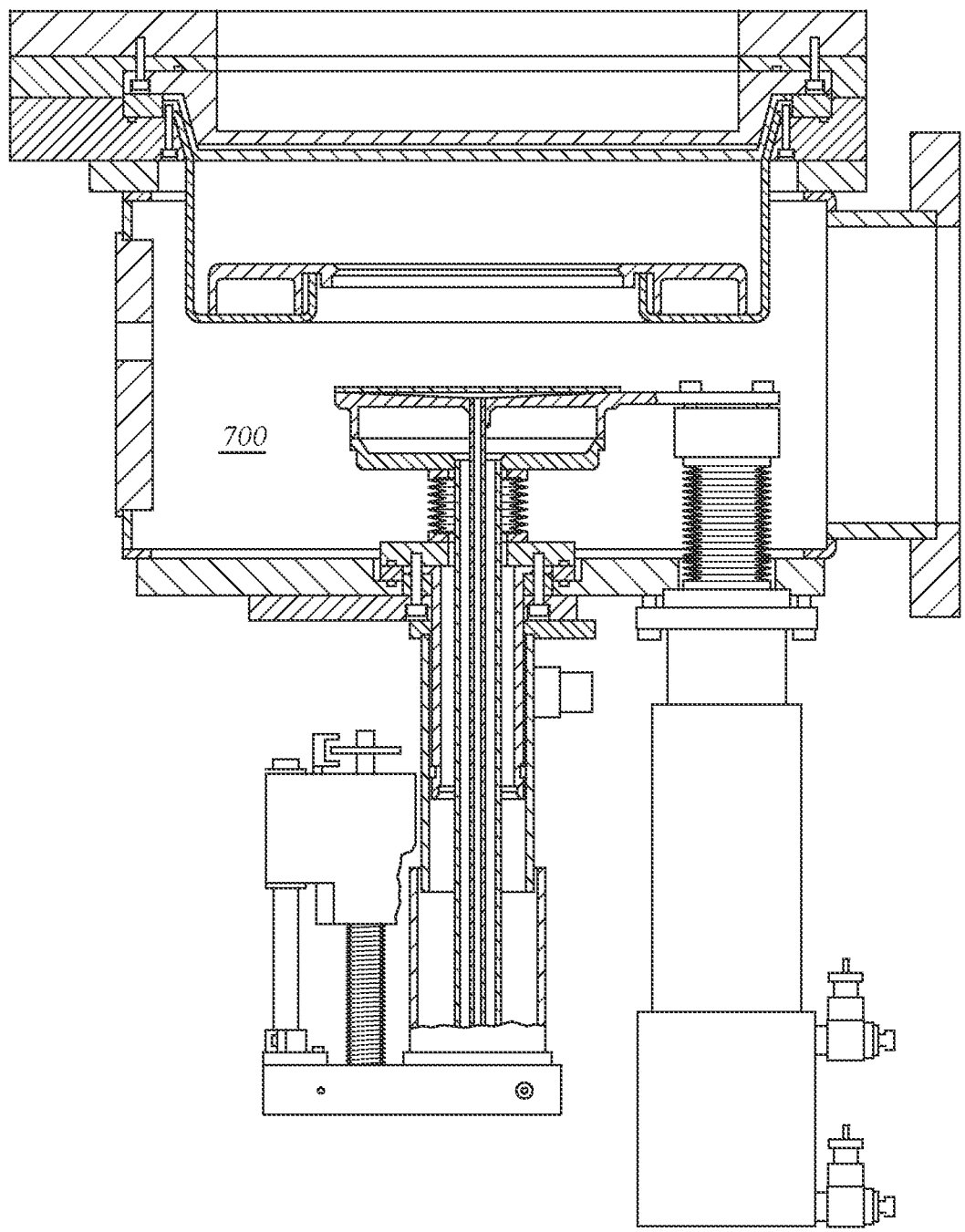
FIG. 7 is a section view of an illustrative physical vapor deposition chamber useful to deposit the layers of the devices shown in FIGS. 2J and 4H.

Referring to FIG. 7, a sputtering chamber 700 is shown coupled to a pedestal and heater actuator 50 for moving a wafer 30 from a first position 12 at which a wafer 30 is received upon a heater plate 32 at a distance from the sputtering target 16, to a second position 14 adjacent to the sputtering target 16 at which the wafer 30 is processed.

Sputtering chamber 700 includes an outer, generally cylindrical wall 18 interconnected to a lower, generally circular base 20 and a cover 22, disposed over wall 18 opposite to the base 20. Cover 22 includes target 16 suspended therefrom, and a wafer edge ring hanger 24, including wafer edge ring 26 suspended thereon, projecting downwardly into chamber 700 from edge ring 22 and in alignment with target 16 and heater plate 32. Wall 18 also includes a slit valve 28 therein. A wafer receiver apparatus 29 is disposed within chamber 700 to receive a wafer 30 for processing in chamber 700. A robot arm (not shown) may enter chamber 700 through slit valve 28 to place a wafer 30 on wafer receiver apparatus 29 therein.

To move the wafer 30 from the first, lower position 12 a distance from target 16 to a second, upper position 14 adjacent target 16 for sputtering a deposition layer thereon, the heater plate 32 is disposed inside of the chamber 700 and is interconnected to the upper terminus of an axially movable pedestal 34. Heater plate 32 is preferably heated by an electrical resistance heater disposed therein. Pedestal 34 includes a tubular extending rod portion 33 and a generally circular plate portion 35 disposed on the upper terminus of rod portion 33. Plate portion 35 is attached to the underside 36 of heater plate 32 and rod portion 33 extends outwardly from the chamber 700 through an aperture 38 in chamber base 20. Receiver apparatus 29 is positioned to receive wafer 30 from a robot and supports the wafer 30 over heater plate 32. Pedestal 34 is movable through aperture 38, and may be moved to pass heater plate 32 through receiver apparatus 29 and thus locate the wafer 30 on heater plate 32 at the lower position 12, and then may be moved further inwardly and upwardly of aperture 38 to locate the wafer 30 on heater plate 32 in the upper position 14 adjacent to the target 16 during sputtering of the target to form a film layer of the target material, or of the target material and a reactive gas present in the chamber. Chamber 700 also includes a gas inlet, a gas outlet, and a vacuum source. During sputtering operations, the chamber 700 is evacuated to a very low pressure on the order of 10−9 torr, and then back filled with a sputtering gas such as Argon to a pressure on the order of 10−3 torr to 10−5 torr and the wafer 30 is moved from the lower position 12 into the upper position 14 adjacent to the target 16 for processing. A DC or RF source electrically connected to the target 16 is energized while gas is supplied into chamber 700. The DC or RF energy ionizes the gas to form a plasma. Ions in the plasma are electrostatically attracted to the target 16 and sputter or dislodge target material, which in turn coats the wafer 30 to thereby deposit a desired layer of target material on wafer 30. Wafer 30 is then withdrawn by heater plate 32 from the upper position 14 to the lower position 12, at which the wafer 30 is returned to receiver apparatus 29 and may be removed through the slit valve 28 by a robot, or additionally processed within the chamber 700.

Figure 8:
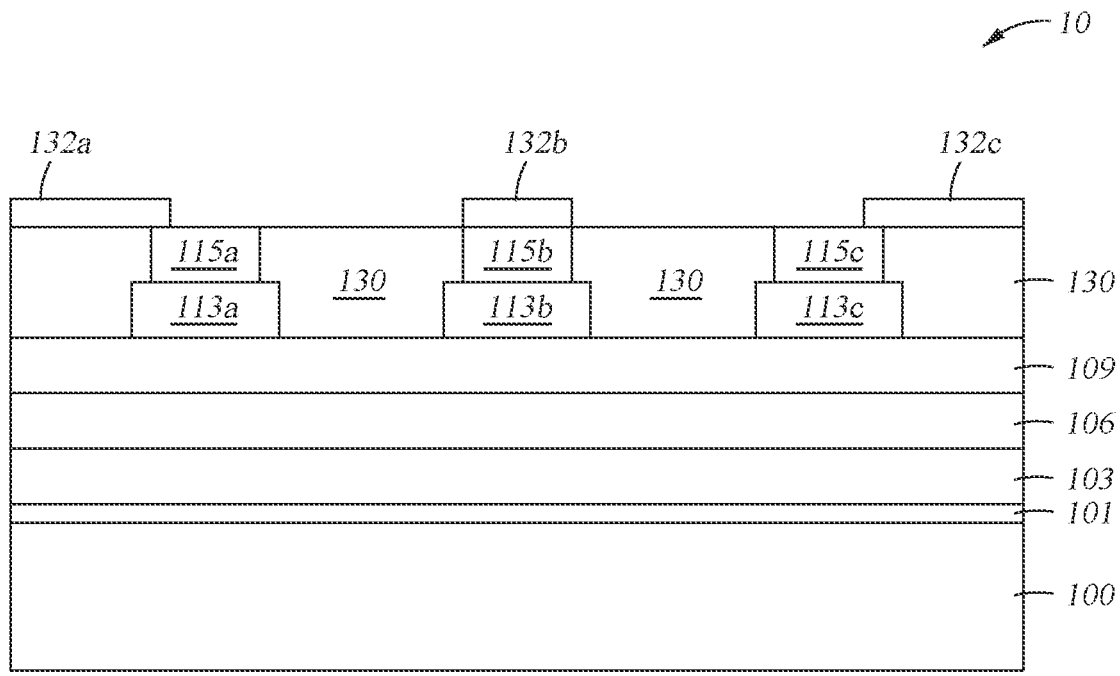
FIG. 8 is a sectional view of a device having a plurality of quantum dots disposed thereon, and electrical leads formed to connect the third electrodes thereof to a power supply.
Figure 9:
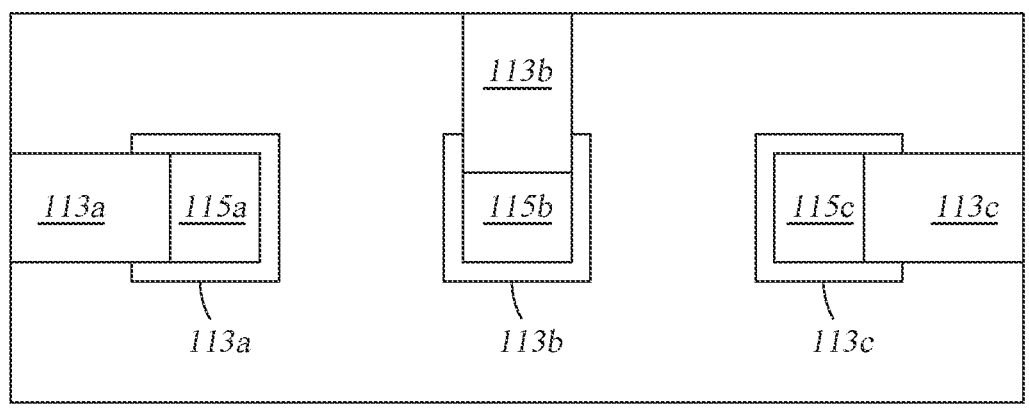
FIG. 9 is a plan view of the device of FIG. 8 having a plurality of quantum dots disposed thereon, and electrical leads formed to connect the third electrodes thereof to a power supply.

Referring now to FIGS. 8 and 9, a single device 12, having a plurality of quantum dots 113a-c thereon, is shown in section and plan views. Here, a plurality of individual quantum emission devices 10 are formed simultaneously on a substrate 100, using the process sequence of FIGS. 4A to 4H. Then a dielectric layer 130 such as, for example, SiO2, is deposited over the exposed portions of the quantum dots 113 and second and third electrodes 109, 115, and planarized using a material removal process, such as chemical mechanical polishing, to leave a dielectric layer 130 having an upper surface generally coplanar with the upper surfaces of the individual third electrodes 115a-c. Then a metal layer is deposited thereover, and patterned, such as by using a lithography process to form a patterned photoresist over the metal layer, and etching through the openings in the patterned mask to leave behind conductive leads 132a-c, each of which is connected to the positive voltage side of the first power supply 118 of FIG. 1.

The invention claimed is:

1. A quantum device, comprising:
a substrate comprising a first material and including an upper surface thereof;
a first layer comprising a compound of the first material disposed on the upper surface of the substrate;
a second layer, comprising a metal oxide, disposed on the first layer;
a third layer, comprising a noble metal, disposed on the second layer;
a fourth layer, comprising a metal oxide, disposed on the third layer;
a fifth layer, comprising a piezoelectric material, disposed on the fourth layer;
a sixth layer, comprising a noble metal, disposed on the fifth layer;
a seventh layer, comprising a material capable of quantum emission, disposed on the sixth layer; and
an eighth layer, comprising a noble metal, disposed on the seventh layer; wherein
at least one of the eighth layer and the seventh layer are sized to enable quantum emission from the seventh layer.

2. The quantum device of claim 1, wherein the noble metal is selected from platinum, gold, silver and ruthenium.

3. The quantum device of claim 1, wherein the second layer is thicker than the fourth layer.

4. The quantum device of claim 1, wherein the metal oxide comprises titanium oxide.

5. The quantum device of claim 4, wherein the fourth layer is a seed layer for the fifth layer.

6. The quantum device of claim 5, wherein the eighth layer is sized to enable quantum emission from the seventh layer.

7. The quantum device of claim 5, wherein the seventh layer is sized to enable quantum emission therefrom.

8. A method of forming a quantum device, comprising:
providing a substrate comprising a first material and including an upper surface thereof;
providing a first layer comprising a compound of the first material disposed on the upper surface of the substrate;
forming a second layer, comprising a metal oxide, disposed on the first layer;
forming a third layer, comprising a noble metal, disposed on the second layer;
forming a fourth layer, comprising a metal oxide, disposed on the third layer;
forming a fifth layer, comprising a piezoelectric material, disposed on the fourth layer;

forming a sixth layer, comprising a noble metal, disposed on the fifth layer;
forming a seventh layer, comprising a material capable of quantum emission, disposed on the sixth layer; and
forming an eighth layer, comprising a noble metal, disposed on the seventh layer; wherein
at least one of the eighth layer and the seventh layer are sized to enable quantum emission from the seventh layer.

9. The method of claim 8, further comprising, providing a vacuum transfer chamber having a plurality of vacuum processing chambers accessible therefrom by transferring a substrate from the transfer chamber to one or more of the vacuum processing chambers while maintaining the substrate in a vacuum environment, and forming the second through seventh layers on the substrate in one or more of the vacuum processing chambers.

10. The method of claim 9, further comprising forming the second through eighth layers on the substrate in one or more of the vacuum processing chambers.

11. The method of quantum device of claim 9, wherein the noble metal is selected from platinum, gold, silver and ruthenium.

12. The method of quantum device of claim 9, wherein the second layer is thicker than the fourth layer.

13. The method of quantum device of claim 9, wherein the metal oxide comprises titanium oxide.

14. The method of quantum device of claim 13, wherein the fourth layer is a seed layer for the fifth layer.

15. The method of quantum device of claim 14, wherein the eighth layer is sized to enable quantum emission from the seventh layer.

16. The method of quantum device of claim 14, wherein the seventh layer is sized to enable quantum emission therefrom.

17. A quantum device, comprising:
a substrate comprising a first material and including an upper surface thereof;
a first layer comprising a compound of the first material disposed on the upper surface of the substrate;
a second layer, comprising a metal oxide, disposed on the first layer;
a third layer, comprising a noble metal, disposed on the second layer;
a fourth layer, comprising a metal oxide, disposed on the third layer;
a fifth layer, comprising a piezoelectric material, disposed on the fourth layer;
a sixth layer, comprising a noble metal, disposed on the fifth layer;
a seventh layer, comprising a material capable of quantum emission, disposed on the sixth layer. the seventh layer; and
an eighth layer, comprising a noble metal, disposed on the seventh layer, the eighth layer comprising a plurality of discrete noble metal islands; wherein
at least one of the noble metal island of the eighth layer and the seventh layer are sized to enable quantum emission from the seventh layer.

18. The quantum device of claim 17, wherein the seventh layer comprises a plurality of island of quantum emission material, each island sized to enable quantum emission therefrom.

19. The quantum device of claim 17, further comprising a ninth layer comprising a dielectric disposed over the sixth layer and the seventh layer, and conductive lead extending from the noble metal island and over the night layer.

20. The quantum device of claim 19, wherein the ninth layer is a dielectric layer.

* * * * *